United States Patent [19]

Sugiyama

[11] Patent Number: 5,451,541
[45] Date of Patent: Sep. 19, 1995

[54] METHOD FOR FABRICATING A SEMICONDUCTOR DEVICE

[75] Inventor: Mitsuhiro Sugiyama, Tokyo, Japan

[73] Assignee: NEC Corporation, Japan

[21] Appl. No.: 340,595

[22] Filed: Nov. 16, 1994

[30] Foreign Application Priority Data

Nov. 17, 1993 [JP] Japan .................................. 5-287892

[51] Int. Cl.$^6$ ............................................ H01L 21/20
[52] U.S. Cl. ........................................ 437/90; 437/8; 437/228; 437/234; 437/238
[58] Field of Search ...................... 437/90, 8, 228, 234, 437/238

[56] References Cited

PUBLICATIONS

"'91 VLSI Symposium"; pp. 51 to 52; Tokyo, Japan; H. Nishizawa et al, Fully SiO$_2$ Isolated High Speed Self-Aligned Bipolar Transistor on Thin SOI (1991).

Primary Examiner—R. Bruce Breneman
Assistant Examiner—Linda J. Fleck
Attorney, Agent, or Firm—Laff, Whitesel, Conte & Saret, Ltd.

[57] ABSTRACT

An insulating film is provided on a single crystal silicon layer of a SOI substrate, and a first groove for device isolation and a second groove for thickness measurement are formed to expose a surface of a silicon substrate of the SOI substrate. Then, the first and second grooves are filled with a filling film, and the filling film is etched back, so that the first groove is still filled with the filling film, while the filling film which have filled the second groove is removed to expose the surface of the silicon substrate, because the second groove has a width larger than that of the first groove.

5 Claims, 2 Drawing Sheets

METHOD FOR FABRICATING A SEMICONDUCTOR DEVICE

FIELD OF THE INVENTION

The invention relates to a method for fabricating a semiconductor device, and more particularly to, a method for fabricating a semiconductor device by using a SOI (Silicon On Insulator) substrate.

BACKGROUND OF THE INVENTION

In a method for fabricating a semiconductor device, it is necessary to measure thickness of insulating films of silicon oxide, etc. and polysilicon films formed on a semiconductor substrate. In a conventional method, the thicknesses are measured by radiating a light beam on the films. For instance, an insulating film is provided on a silicon substrate, and a film, a thickness of which is to be measured, is provided to contact via an aperture of the insulating film with the silicon substrate.

In measuring the thickness of the film, a light beam is radiated on the film, and strength-wavelength distribution of a light beam reflected from the film is measured. In this manner, the thickness of the film is measured on the basis of the wavelength distribution of a reflected light beam.

In the conventional method for measuring a thickness of a film in the fabrication of a semiconductor device, however, there is a disadvantage in that it is difficult to analyze the wavelength distribution of a reflected light beam, so that the reliability of a semiconductor device thus fabricated is hard to be enhanced.

Further, if a semiconductor device is fabricated on a SOI substrate as described on pages 51 and 52 of the paper in the '91 VLSI symposium, a single crystal silicon layer which is a part of the SOI substrate tends to deviate in thickness. Therefore, a thickness of the single crystal silicon layer for the SOI substrate must be measured precisely.

SUMMARY OF THE INVENTION

Accordingly, it is an object of the invention to provide a method for fabricating a semiconductor device in which the measurement of film thickness is carried out without difficulty.

It is a further object of the invention to provide a method for fabricating a semiconductor device in which a semiconductor having a high reliability is fabricated.

It is a still further object of the invention to provide a method for fabricating a semiconductor device in which a thickness of a single crystal silicon layer of a SOI substrate is precisely measured.

According to the invention, a method for fabricating a semiconductor substrate, comprising the steps of:

providing a second insulating film on the single crystal semiconductor layer;

providing first and second grooves through the second insulating film, the single crystal semiconductor layer, and the first insulating film to expose a surface of the semiconductor substrate, the first groove being for separating devices, and the second groove being for measuring a thickness of the single crystal semiconductor layer, a width of the second groove being larger than a width of the first groove;

providing a filling film for filling the first and second grooves; and etching the filling film to expose the surface of the semiconductor substrate in accordance with a removal of the filling film from the second groove, the first groove being still filled with the filling film.

BRIEF DESCRIPTION OF THE DRAWINGS

The invention will be explained in more detail in conjunction with appended drawings, wherein.

DESCRIPTION OF THE PREFERRED EMBODIMENTS

Before explaining a method for fabricating a semiconductor device in the preferred embodiment, the aforementioned conventional method for measuring a thicknesses of an insulating film will be explained in FIG. 1.

Figure 1:
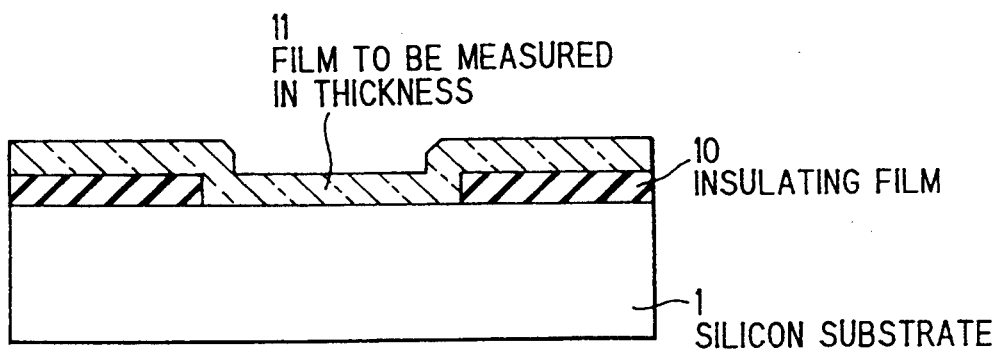
FIG. 1 is a cross-sectional view showing a silicon substrate covered with a film, a thickness of which is to be measured.

In FIG. 1, an insulating film is provided on a silicon substrate 1, and a film 11, a thickness of which is to be measured, is provided to contact via an aperture of the insulating film 10 with the silicon substrate 1.

In measuring the thickness of the film 11, a light beam is radiated on the film 11, and strength-wavelength distribution of a light beam reflected from the film 11 is measured. In this manner, the thickness of the film 11 is measured on the basis of the wavelength distribution of a reflected light beam.

Next, a method for measuring a semiconductor device in the preferred embodiment will be explained in FIGS. 2A to 2D.

Figure 2A:
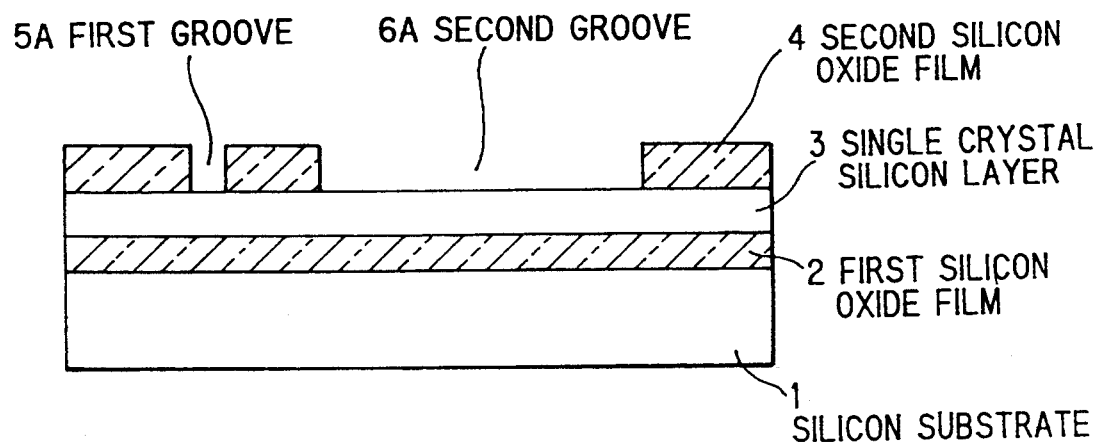
FIGS. 2A to 2D are cross-sectional views showing a method for fabricating a semiconductor device in a preferred embodiment according to the invention.

In FIG. 2A, a SOI substrate is prepared by providing a first silicon oxide film 2 having a thickness of approximately 0.3 $\mu$m and a single crystal silicon layer 3 having a thickness of approximately 3 $\mu$m successively on a silicon substrate 1. Then, a second silicon oxide film 4 having a thickness of approximately 0.5 $\mu$m is formed on the single crystal silicon layer 3 by CVD process, and a first groove (trench) 5A for separating devices and a second groove (trench) 6A for measuring its thickness are formed through the second silicon oxide film 4 by selectively etching the second silicon oxide film 4. The second groove 6A is provided on an area such as a periphery of a chip region where no semiconductor device is formed.

Figure 2B:
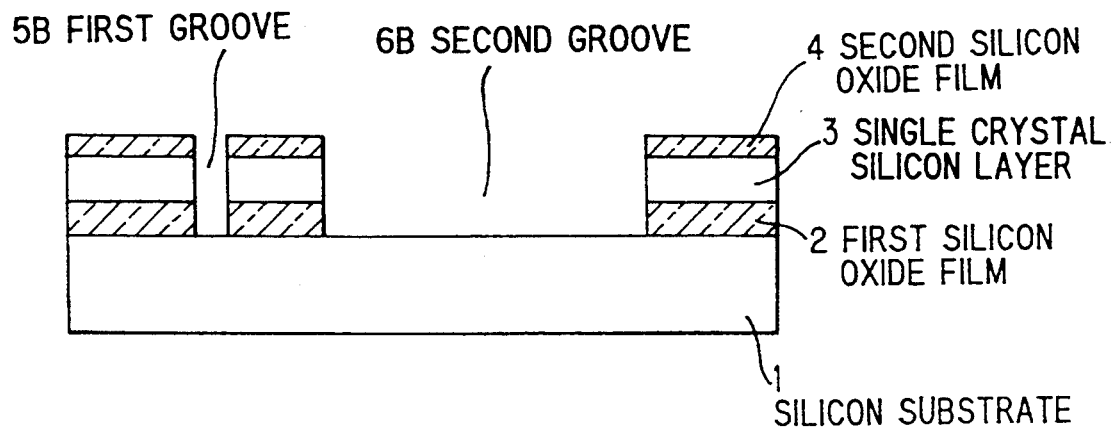

In FIG. 2B, the second silicon oxide film 4 is used as a mask to etch the single crystal silicon layer 3, and the first silicon oxide film 2 by dry-etching process. Thus, a first groove 5B having a width of approximately 1 $\mu$m for separating the devices and a second groove 6B having a width of approximately 10 $\mu$m for measuring the thickness are formed. At the same time, although the second silicon oxide film 4 is etched, a predetermined thickness of the second silicon oxide film 4 is approximately left on the single crystal silicon layer 3, the second silicon oxide film 4 is formed to be sufficiently thicker than the first silicon oxide film 2.

Figure 2C:
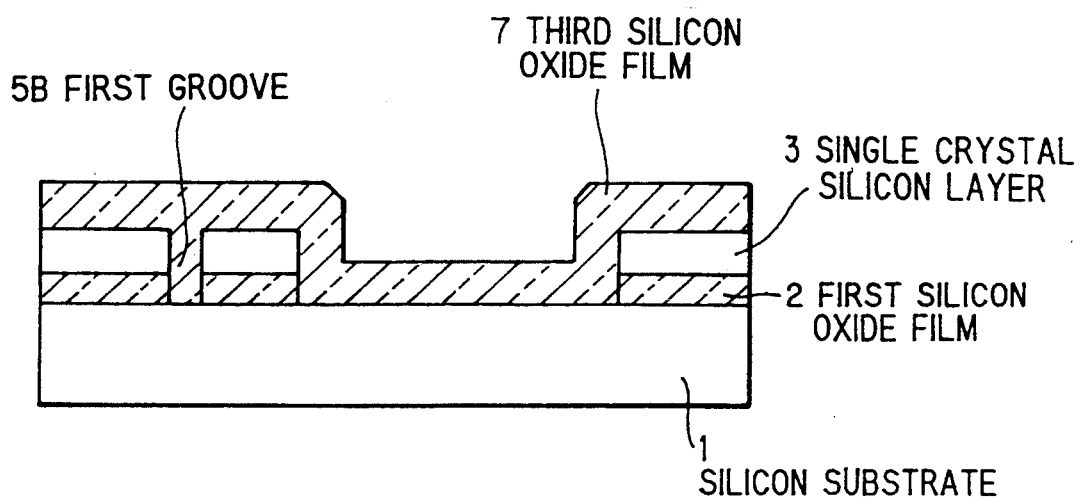

In FIG. 2C, a third silicon oxide film 7 having a thickness of approximately 2 $\mu$m is formed on the second silicon oxide film 4 and in the first and second grooves 5B and 6B.

Figure 2D:
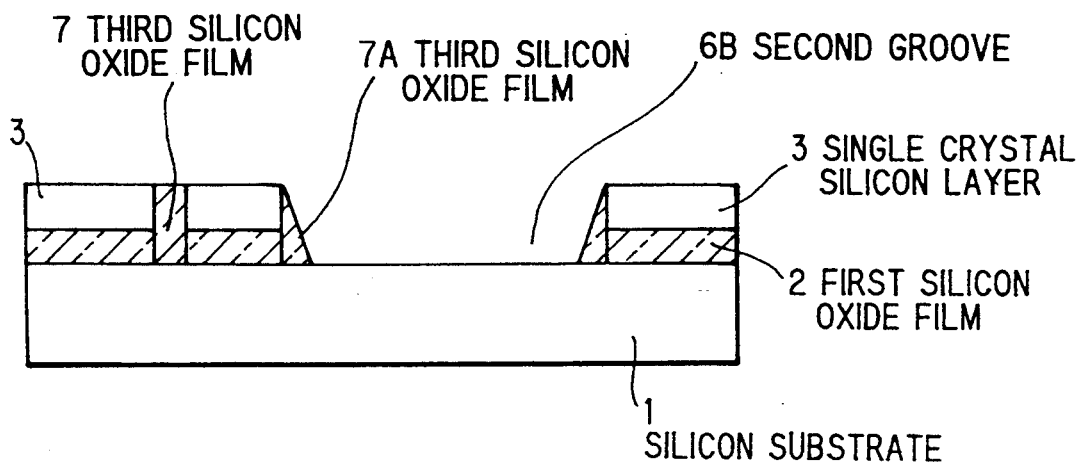

In FIG. 2D, the third silicon oxide film 7 is etched back, so that the first groove 5B is still buried with the third silicon oxide film 7, while the second groove 6B is only covered on a side wall with the left third silicon oxide film 7A, thereby exposing the top surface of the silicon substrate 1, because the width of the second groove 6B is sufficiently larger than that of the first groove 5B.

Only if the second groove 6B has a size of approximately at least 10 μm×10 μm, the film thickness can be measured during a fabrication process of a semiconductor device. The number of film thickness-measuring grooves is sufficient to be one for one chip region. Therefore, there is no substantial area-increase in opening apertures or grooves, so that an etching speed depending on the aperture or groove opening area is not affected by conducting the invention.

In the preferred embodiment, the silicon oxide film is used for the first groove to be buried therewith. However, this film may be replaced by one of other insulating films or an inner insulating film covering the inner surface of the first groove and a polysilicon film filling an aperture defined by the inner insulating film.

Although the invention has been described with respect to specific embodiment for complete and clear disclosure, the appended claims are not to be thus limited but are to be construed as embodying all modification and alternative constructions that may be occur to one skilled in the art which fairly fall within the basic teaching here is set forth.

What is claimed is:

1. In a method for fabricating a semiconductor device by using a silicon-on-insulator substrate comprising a semiconductor substrate, a first insulating film provided on said semiconductor substrate, and a single crystal semiconductor layer provided on said first insulating film, said method comprising the steps of:

providing a second insulating film on said single crystal semiconductor layer;

providing first and second grooves through said second insulating film, said single crystal semiconductor layer, and said first insulating film to expose a surface of said semiconductor substrate, said first groove being for separating devices, and said second groove being for measuring a thickness of said single crystal semiconductor layer, a width of said second groove being larger than a width of said first groove;

providing a filling film for filling said first and second grooves; and etching said filling film to expose said surface of said semiconductor substrate in accordance with a removal of said filling film from said second groove, said first groove being still filled with said filling film.

2. The method as defined in claim 1, wherein:
    said filling film is a silicon oxide film.

3. The method as defined in claim 1, wherein:
    said filling film is a polysilicon film, said polysilicon film filling an aperture defined by an insulating film covering an inner surface of said first groove.

4. The method as defined in claim 1, wherein:
    said semiconductor substrate is a silicon substrate; and
    said single crystal semiconductor layer is a single crystal silicon layer.

5. The method as defined in claim 1, wherein:
    said first groove is approximately 1 μm in width; and
    said second groove is approximately 10 μm in width.

* * * * *